United States Patent [19]

Millns et al.

[11] 4,219,743

[45] Aug. 26, 1980

[54] BUFFER CIRCUIT

[75] Inventors: John K. Millns, Mottisfont; Clive Weeks, Southampton, both of England

[73] Assignee: U.S. Philips Corporation, New York, N.Y.

[21] Appl. No.: 941,675

[22] Filed: Sep. 12, 1978

[30] Foreign Application Priority Data

Sep. 26, 1977 [GB] United Kingdom ............... 39946/77

[51] Int. Cl.$^2$ ..................... H03K 17/04; H03K 17/12; H03K 17/28; H03K 17/60
[52] U.S. Cl. .................................. 307/270; 307/251; 307/DIG. 4
[58] Field of Search ......... 307/205, 251, 270, DIG. 1, 307/DIG. 4, DIG. 5

[56] References Cited

U.S. PATENT DOCUMENTS

| | | | |
|---|---|---|---|
| 3,631,267 | 12/1971 | Heimbigner | 307/DIG. 4 X |
| 3,641,370 | 2/1972 | Heimbigner | 307/DIG. 4 X |
| 3,778,784 | 12/1973 | Karp et al. | 307/DIG. 4 X |
| 3,898,479 | 8/1975 | Proebsting | 307/DIG. 4 X |
| 3,937,983 | 2/1976 | Reed | 307/DIG. 4 X |
| 4,042,838 | 8/1977 | Street et al. | 307/251 X |
| 4,049,979 | 9/1977 | Shieu et al. | 307/DIG. 4 X |
| 4,063,117 | 12/1977 | Langesen | 307/DIG. 4 X |
| 4,071,783 | 1/1978 | Knepper et al. | 307/DIG. 4 X |
| 4,093,875 | 6/1978 | Knepper | 307/DIG. 4 X |
| 4,122,361 | 10/1978 | Clemen et al. | 307/251 X |

OTHER PUBLICATIONS

Harroun, *IBM Tech. Discl. Bull.*, vol. 19, No. 3, pp. 827–828, Aug. 1976.
Danielski et al., *IBM Tech. Discl. Bull.*, vol. 18, No. 4, pp. 1033–1034, Sep. 1975.
Kalter et al., *IBM Tech. Discl. Bull.*, vol. 18, No. 4, pp. 1028–1029, Sep. 1975.
Anderson et al., *IBM Tech. Discl. Bull.*, vol. 16, No. 1, pp. 50–51, Jun. 1973.

*Primary Examiner*—Larry N. Anagnos
*Attorney, Agent, or Firm*—Thomas A. Briody; Jack Oisher; James J. Cannon, Jr.

[57] ABSTRACT

A buffer circuit for yielding a high output quickly while consuming low power having an input terminal, an output terminal, a pair of power supply rails, a bootstrapping capacitance, an output circuit coupled between the supply rails and having an input connected to one side of the capacitance and an output connected to the output terminal, a delay device coupled to the input terminal and connected to the other side of the capacitance, the delay time provided by the delay device enabling the capacitance to be charged in response to an input signal applied to the input terminal, and switching means responsive to the change in potential at the other side of the capacitance to lift the potential at the one side of the capacitance above that of the supply rails and thereby lift the potential of the output terminal.

14 Claims, 2 Drawing Figures

BUFFER CIRCUIT

BACKGROUND OF THE INVENTION

The present invention relates to a buffer circuit, and more particularly to a fast output buffer circuit giving a full range of output volts.

Such a buffer circuit may comprise a bootstrap circuit of the type used in an integrated circuit known as Intel 2401 (2K n-channel shift register). This circuit includes an input terminal connected to the gates of first and second field effect transistors. The first transistor constitutes an input transistor and its drain is connected to one side of a bootstrapping capacitor and to a load resistance. The source-drain path of the second transistor is connected in series with the source-drain path of a third field effect transistor and the series combination is connected between a pair of power supply rails. An output terminal is connected to the common connection between the second and third transistors. The gate of the third transistor is connected to the other side of the bootstrapping capacitor and a fourth field effect transistor having its gate-drain shorted together forms a clamp connected between the junction of the other side of the capacitance and the gate of the third transistor and one of the supply rails. One of the disadvantages of this known circuit is that when the input goes from low to high, the gates of the first and second transistors go high and their drains go low, the gate of the third transistor goes low but as the capacitor becomes charged, the gate of the third transistor goes high and in this situation the series connected second and third transistors are both conductive causing an excessive current drain from the supply.

Further in this known circuit it is not possible to predetermine how quickly the circuit will reach full output voltage.

Accordingly, it is desired to provide a buffer circuit which is able to produce a high output quickly, that is to say 18 nS (nanoseconds), while at the same time does not consume too much power.

According to the present invention there is provided a buffer circuit comprising an input, an output, first and second field effect transistors (FETs) having their source-drain paths connected in series between a pair of power supply rails, the junction of said source-drain paths being connected to the output, first and second circuits connected between the input and the gates of the first and second FETs, respectively, said first and second circuits being operative in response to changes in a signal applied to the input to render one of the first and second FETs conductive at any one time, said first circuit including a bootstrapping capacitance having one side connected to the gate of the first FET and another side coupled to an output of a delay circuit, the delay period of which circuit determines the charging time of the capacitance, an input of the delay circuit being coupled to the first-mentioned input, switching means for connecting the one side of the capacitance to a current charging source and switch control means response to a predetermined change in a signal at the input to enable charging of the capacitance to commence and responsive to a subsequent predetermined change at the output of the delay circuit at the end of said delay period to isolate the capacitance by rendering the switch non-conductive, thereby lifting the potential at the other side of the capacitance and allowing the potential at the gate of the first FET to be lifted above that of the supply rails and in so doing lifting the potential at the output.

The first circuit may further include a third field effect transistor having its gate connected to the input and its drain coupled to the input of the delay circuit.

The second circuit may include a further FET coupling the input to the gate of the second FET. The gate of the further FET is connected to the input and its drain is connected to the gate of the second transistor. Accordingly, when the signal at the input is low, the gate of the second transistor is high while that of the first transistor is low, and when the input is high, the reverse happens and accordingly both the first and second transistors are not conductive at the same time causing undesirable current drain.

Further, the switching means enables the gate of the first transistor to remain low until the bootstrapping operation is ready to occur via the delay circuit and thereafter the potential of the gate of the first transistor is lifted rapidly by the switching means being turned-off. As a result the buffer circuit is able to operate at high speed.

The switching means which may conveniently comprise a fourth field effect transistor having its source connected to the one side of the capacitance, may be controlled by logic means such as a NOR gate having one input connected to the drain of the third transistor and another input connected to the output of the delay circuit. By using directly connected components in this way the operating time of the drive circuit is kept to the minimum possible.

The capacitance may comprise the gate-channel of another field effect transistor. By using field effect transistors of depletion and enhancement types, as appropriate, the circuit may readily be constructed as an integrated circuit.

In order to overcome the possiblility of the potential at the output terminal dropping prematurely by the charge on the capacitance leaking away too quickly, means such as a depletion mode field effect transistor connected as a resistance, may be connected between the output terminal and the one supply rail to hold the output terminal at the rail voltage until the input goes low again.

DESCRIPTION OF THE PREFERRED EMBODIMENT

Figure 1:
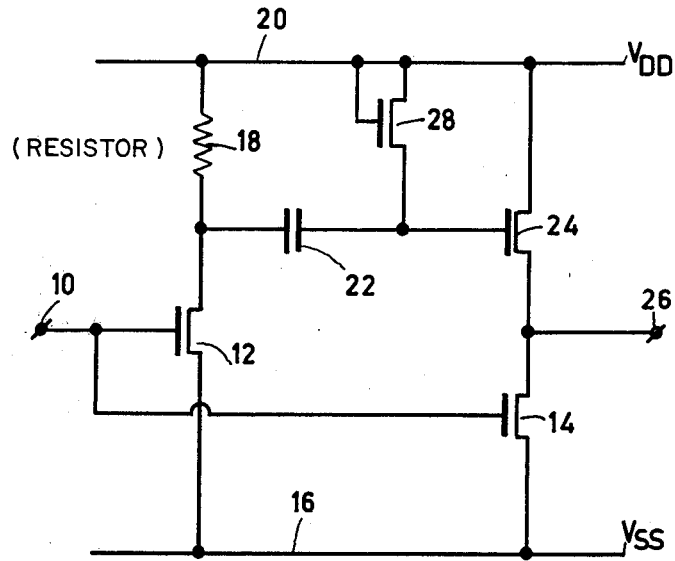
FIG. 1 is a schematic circuit diagram of a known bootstrapping circuit.

Referring to FIG. 1, the circuit shown comprises an input terminal 10 which is connected to the gate electrodes of enhancement mode field effect MOS transistors (MOSFETS) 12 and 14. The source electrodes of the transistors 12 and 14 are connected to a supply rail 16 maintained at level $V_{SS}$. A resistor 18 is connected between the drain of the transistor 12 and a supply rail 20 at $V_{DD}$ volts. A bootstrapping capacitor 22 is connected between the drain of the transistor 12 and the gate of an enhancement type MOSFET 24. The drain of the transistor 24 is connected to the rail 20 and its source is connected to the drain of the transistor 14. An output terminal 26 is connected to the common connection between the transistors 14 and 24.

An enhancement mode MOSFET 28 connected to form a clamp is connected between the junction of the capacitor and the gate of the transistor 24 and the rail 20.

The circuit of FIG. 1 operates as follows:

When the input terminal 10 is low, the gates of the transistors 12 and 14 are low, and the gate of the transistor 24 is high and approaches the potential of the rail 20. The transistor 28 is nearly cut-off and thus presents a high resistance. The charge on the capacitor 22 has leaked away.

When the input terminal 10 goes high, the gates of the transistors 12 and 14 go high and their drains go low, causing the gate of the transistor 24 to go low. The capacitor 22 charges through the transistor 28 taking the gate of the transistor 24 high again so that both output transistors 14 and 24 are conductive and drawing current from the supply rails 16, 20.

When the input terminal 10 next goes low, the gates of the transistors 12 and 14 go low. The drain of the transistor 12 goes high taking the left hand plate of the capacitor towards the potential of the rail 20, that is towards $V_{DD}$, and hence the right hand plate of the charged capacitor 22 to above $V_{DD}$. Thus the gate of the transistor 24 is taken above $V_{DD}$ and thereby the transistor 24 source to $V_{DD}$ causing the output terminal to go to $V_{DD}$ as well. Thereafter the charge on the capacitor 22 leaks away and the circuit is ready to receive the next change at the input terminal 10.

Figure 2:
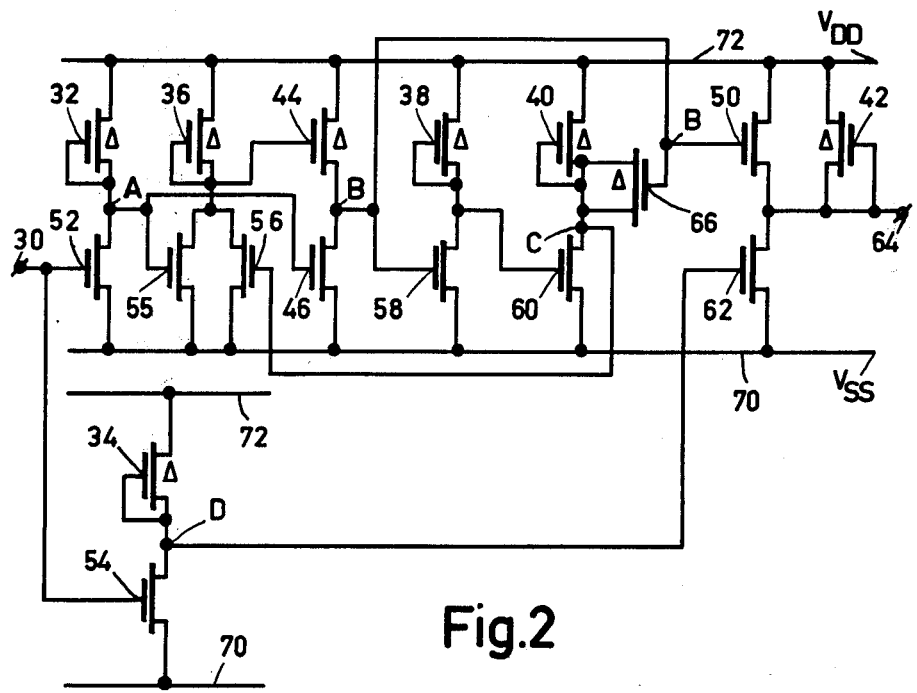
FIG. 2 is a schematic circuit diagram of the preferred embodiment of a buffer circuit in accordance with the present invention.

Referring to FIG. 2 which shows a buffer circuit in accordance with the present invention. The circuit includes a bootstrapping capacitor formed by the insulating layer between the gate and channel, between the substrate, source and drain of a depletion mode MOSFET 66. The circuit further includes depletion mode MOSFETs 32, 34, 36, 38, 40 and 42 which have their gate-source electrodes interconnected so that they constitute resistive devices. A further depletion mode MOSFET 44 is provided and this transistor acts as a switching device. The remainder of the transistors 46, 52, 54, 55, 56, 58, 60 and 62 are enhancement mode MOSFETs.

A NOR gate is formed by the transistors 55, 56. The gate electrode of the transistor 55 is connected to the drain of the transistor 52 and the gate electrode of the transistor 56 is connected to the drain of the transistor 60.

A non-inverting delay circuit is formed by the inverting transistors 58, 60. By having this delay circuit the voltage at the point C, the junction of the drain of the transistor 60 and the channel of the transistor 66 assumes that at the point B, the drain of the transistor 46, after a finite time.

An input terminal 30 is connected to the gates of the transistors 52, 54, the sources of which are connected to a supply rail 70 at a voltage $V_{SS}$ which may be ground. The transistors 52, 54 have load transistors 32 and 34 connecting a supply rail 72 at a voltage $V_{DD}$, which may be at 8 to 10 volts positive relative to the rail 70, to the drains of the transistors 52, 54, respectively. The drain of the transistor 52 is connected to the gates of the transistors 46 and 55, and the drain of the transistor 54 is connected to the gate of the transistor 62, the drain of which is connected to an output terminal 64.

The drain-source path of the transistor 44 is connected in series with the drain-source path of the transistor 46. The drain of the transistor 44 is connected to the rail 72 and the source of the transistor 46 is connected to the rail 70. The connection between the transistors 44, 46, that is the point B, is connected both to one end of the delay circuit formed by the inverting transistors 58 and 60 and to a junction of the gates of the transistors 50 and 66 which together form an output circuit.

The drain-source paths of the transistors 50 and 62 are connected in series between the rails 72, 70 and the common connection therebetween is connected to the output terminal 64. The drain-source path of the transistor 42 is connected between the terminal 64 and the rail 72.

In operation of the circuit shown in FIG. 2, when the input is low, the gates of the transistors 52 and 54 are low and their drains, points A and D, are high, the drain of the transistor 46, point(s) B, is low, the drain of the transistor 60, point C, is low, the capacitor formed by the transistor 66 is discharged, the drain of the transistor 50 is high, the drain of the transistor 62 is low and the output terminal 64 is low.

When the input terminal 30 goes high, the gates of the transistors 52, 54 go high and the transistors 52, 54 are rendered conductive so that their drains, points A and D respectively, become low. The gates of the transistors 46 and 55 also go low causing their respective drains to go high. The gate of the transistor 62 goes low, switching this transistor off, subsequently the transistor 50 conducts and its source starts to go high.

The output of the NOR gate (transistors 55, 56) goes high causing the switching transistor 44 to be rendered more conductive. This action causes the voltage at the point B to be of the order of 5 to 6 volts, assuming $V_{DD}$ to be 8 to 10 volts. At that time, the drain of the transistor 60 is still low and the potential difference across the gate-substrate of the transistor 66 causes a charge to build-up. After a time delay determined by the components of the delay circuit, the drain of the transistor 60 goes high. The NOR gate clamps the gate of the transistor 44 substantially at the voltage of the rail 70 and the transistor 44 is turned off, allowing the potential at the gate of the transistor 50 to be lifted to about 12 to 14 volts by the bootstrapping effect of the capacitance formed by the transistor 66 and in so doing the source potential of the transistor 50 is lifted to that of the rail 72 and a signal of the order of 10 volts (equal to $V_{DD}$) is applied to the output terminal 64.

If the amplitude of the signal on the terminal 64 begins to decay prematurely due to the charge on the bootstrap capacitor decaying too quickly, the terminal 64 is maintained at the output of the rail 72 by the low gain transistor 42.

When the input signal goes low, the points A and D go high, the point (s) B go low and the bootstrap capacitor discharges causing the point C to go low.

In the illustrated embodiment of the buffer circuit in accordance with the present invention, the power consumption is reduced substantially, for example by 5:1, compared with the circuit of FIG. 1 because among other things the output transistors 50, 62 (FIG. 2) are on alternately whereas, in FIG. 1, the transistors 14 and 24 are on at the same time. Furthermore as the delay time of the delay circuit can be made of the order of 15 nS, the circuit is suitable for high speed switching applications.

The illustrated embodiment of the invention is suitable for fabrication as an integrated circuit as all the transistors are MOSFETs. By varying the width to length ratio of the gates of the transistors, the circuit may be adapted for use with other supply voltages, such as 4.5 to 5.5 volts.

What we claim is:

1. A buffer circuit comprising an input terminal, an output terminal, first and second field effect transistors (FETs) having their source-drain paths connected in series between a pair of power supply rails, the junction of said source-drain paths being connected to the output, first and second circuits connected between the output terminal and the gates of the first and second FETs, respectively, said first and second circuits being operative in response to changes in a signal applied to the input terminal to render only one of the first and second FETs conductive at any one time, said first circuit including a bootstaping capacitance having one side connected to the gate of the first FET and another side coupled to an output of a delay circuit, the delay period of which circuit determines the charging time of the capacitance, an input of the delay circuit being coupled to the input terminal, switching means for connecting the one side of the capacitance to a current charging source and switch control means responsive to a predetermined change in a signal at the input terminal to enable charging of the capacitance to commence and responsive to a subsequent predetermined change at the output of the delay circuit at the end of said delay period to isolate the capacitance by rendering said switching means non-conductive, thereby lifting the potential at the other side of the capacitance and allowing the potential at the gate of the first FET to be lifted above that of the supply rails and in so doing lifting the potential at the output terminal.

2. A buffer circuit as claimed in claim 1, wherein the second circuit includes a further FET coupling the input terminal to the gate of the second FET, the gate of the further FET being connected to the input terminal and its drain being connected to the gate of the second FET.

3. A buffer circuit as claimed in claim 1 or 2, wherein the first circuit includes a third FET having its gate connected to the input terminal and its drain coupled to the input of the delay circuit.

4. A buffer circuit as claimed in claim 3, wherein the switch control means comprise logic means.

5. A buffer circuit as claimed in claim 4, wherein the logic means comprises a NOR gate having a first input connected to the drain of the third FET, a second input connected to the output of the delay circuit, and an output connected to the switching means.

6. A buffer circuit as claimed in claim 5, wherein the switching means comprises a fourth FET having its gate connected to the output of the NOR gate, its drain coupled to the one supply rail and its source connected to a junction of the drain of a fifth FET, the one side of the capacitance and the input of the delay circuit, and wherein the gate of the fifth transistor is connected to te drain of the third transistor.

7. A buffer circuit as claimed in claim 6, wherein the fourth transistor is a depletion mode FET and the first, second, third and fifth FETs are enchancement mode FETs, and wherein the capacitance is formed by the gate and channel of a depletion mode field effect transistor.

8. A buffer circuit as claimed in claim 7, wherein the delay circuit comprises two enhancement mode FETs connected to form a non-inverting delay circuit.

9. A buffer circuit as claimed in claims 1 or 2, wherein the switch control means comprise logic means.

10. A buffer circuit as claimed in claim 9, wherein the logic means comprises a NOR gate having a first input connected to the drain of the third FET, a second input connected to the output of the delay circuit, and an output connected to the switching means.

11. A buffer circuit as claimed in claim 10, wherein the switching means comprises a fourth FET having its gate connected to the output of the NOR gate, its drain coupled to the one supply rail and its source connected to a junction of the drain of a fifth FET, the one side of the capacitance and the input of the delay circuit, and wherein the gate of the fifth transistor is connected to the drain of the third transistor.

12. A buffer circuit as claimed in claim 11, wherein the fourth transistor is a depletion mode FET and the first, second, third and fifth FETs are enhancement mode FETs, and wherein the capacitance is formed by the gate and channel of a depletion mode field effect transistor.

13. A buffer circuit as claimed in claim 12, wherein the delay circuit comprises two enhancement mode FETs connected to form a non-inverting delay circuit.

14. A buffer circuit as claimed in claim 1 further comprising means connected to the output to maintain the potential at the output lifted at least for a period corresponding substantially to that of the input signal.

* * * * *